United States Patent
Inoue et al.

(10) Patent No.: US 8,344,407 B2
(45) Date of Patent: Jan. 1, 2013

(54) WHITE LIGHT SOURCE, BACKLIGHT, LIQUID CRYSTAL DISPLAY APPARATUS, AND ILLUMINATING APPARATUS

(75) Inventors: Tetsuo Inoue, Yokohama (JP); Hajime Takeuchi, Yokohama (JP); Yasumasa Ooya, Chigasaki (JP); Toshio Shimaoogi, Hiratsuka (JP); Yasuhiro Shirakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 221 days.

(21) Appl. No.: 12/995,352

(22) PCT Filed: May 28, 2009

(86) PCT No.: PCT/JP2009/059780
§ 371 (c)(1),
(2), (4) Date: Nov. 30, 2010

(87) PCT Pub. No.: WO2009/145259
PCT Pub. Date: Dec. 3, 2009

(65) Prior Publication Data
US 2011/0073899 A1    Mar. 31, 2011

(30) Foreign Application Priority Data
May 30, 2008  (JP) .................................. 2008-142295

(51) Int. Cl.
  *H01L 33/00*  (2010.01)
(52) U.S. Cl. ................................. 257/98; 257/E33.061
(58) Field of Classification Search .......... 313/484–487, 313/489, 498, 512, 467, 468, 499, 501–503; 257/98, 99, 100, 79–81, E33.061; 362/235, 362/227, 231, 293, 545, 800; 345/44, 46; 438/22, 26, 458
See application file for complete search history.

(56) References Cited

U.S. PATENT DOCUMENTS
2004/0135504 A1    7/2004  Tamaki et al.
(Continued)

FOREIGN PATENT DOCUMENTS
JP    11 298047    10/1999
(Continued)

OTHER PUBLICATIONS
International Search Report issued Jun. 30, 2009 in PCT/JP09/059780 filed May 28, 2009.
International Preliminary Report on Patentability with Written Opinion issued on Jan. 11, 2011 in PCT/JP2009/059780 filed May 28, 2009.

*Primary Examiner* — Anh Mai
*Assistant Examiner* — Elmito Breval
(74) *Attorney, Agent, or Firm* — Oblon, Spivak, McClelland, Maier & Neustadt, L.L.P.

(57) ABSTRACT

A white light source includes: an insulating substrate; a light-emitting diode chip provided on the insulating substrate and that emits ultraviolet light with a wavelength of 330 nm to 410 nm; and a phosphor layer formed to cover the light-emitting diode chip, including a red emitting phosphor, a green emitting phosphor, and a blue emitting phosphor as a phosphor, and the phosphors are dispersed in a cured transparent resin, wherein when it is assumed that the shortest distance between a surface of the phosphor layer and a peripheral portion of the light-emitting diode chip is t(mm) and the mean free path defined by the following expression (1) is L(mm), the t and L satisfy $3.2 \leq t/L$.

[Expression 1]

$$L = 1/(n \times \sigma) \quad (1)$$

(n: number of phosphors per unit volume of the phosphor layer (pcs/mm$^3$), and $\sigma$: average cross section area of a phosphor in the phosphor layer (mm$^2$)).

10 Claims, 2 Drawing Sheets

| U.S. PATENT DOCUMENTS | | | | FOREIGN PATENT DOCUMENTS | | |
|---|---|---|---|---|---|---|
| 2006/0038477 A1 | 2/2006 | Tamaki et al. | JP | 2004 071726 | 3/2004 |
| 2008/0089825 A1 | 4/2008 | Tamaki et al. | JP | 2006 324418 | 11/2006 |
| 2009/0072708 A1 | 3/2009 | Tamaki et al. | JP | 2008 077104 | 4/2008 |

WHITE LIGHT SOURCE, BACKLIGHT, LIQUID CRYSTAL DISPLAY APPARATUS, AND ILLUMINATING APPARATUS

TECHNICAL FIELD

The present invention relates to a white light source using a light-emitting diode, as well as a backlight, a liquid crystal display apparatus, and an illuminating apparatus using the white light source.

BACKGROUND ART

Conventionally, there has been known a white light Source using a light-emitting diode (LED). The white light source using the LED is such that a phosphor layer is formed on a light emitting surface of an LED chip by mixing a phosphor and a transparent resin, and the color emitted by the LED chip and the color emitted by the phosphor are combined to produce white light. For example, Japanese Patent No. 3509665 (Patent Document 1) discloses a white light source combining a blue LED having an emission peak at 420 to 490 nm and a yellow phosphor. However, there is a problem that the white light obtained from the white light source has high intensity, but is pseudo white with a slight yellow tint and has poor color reproducibility.

As a white light source with improved color reproducibility, for example, Japanese Patent Laid-Open No. 2007-96133 (Patent Document 2) has recently proposed a white light source combining an ultraviolet light-emitting diode having an emission peak at 370 to 410 nm and a phosphor layer containing a blue phosphor, a green phosphor, and a red phosphor. According to the white light source, color reproducibility is improved and pure white light is obtained by using a blue phosphor, a green phosphor, and a red phosphor.

Patent Document 1: Japanese Patent No. 3509665
Patent Document 2: Japanese Patent Laid-Open No. 2007-96133

DISCLOSURE OF THE INVENTION

Problems to be Solved by the Invention

The white light source disclosed in Patent Document 2 improves color reproducibility of white light by combining an ultraviolet light-emitting diode, a blue phosphor, a green phosphor, and a red phosphor, but has a problem in that mixing three kinds of phosphors in the phosphor layer makes it difficult to adjust the dispersion state of phosphors and thus has poor light distribution. For example, the white light source disclosed in Patent Document 2 can stabilize the light emitting direction using a reflector as disclosed in Patent Document 2 and thus can improve light distribution, but use of a structure in which the phosphor layer is provided in a cannonball shape like Patent Document 1 causes variation in light distribution. If the white light source has a variation in light distribution, a configuration of a backlight and an illuminating apparatus using a plurality of white light sources disadvantageously causes color unevenness of white light.

In view of the above circumstances, the present invention has been made, and an object of the present invention is to provide a white light source with good light distribution, as well as a backlight, a liquid crystal display apparatus, and an illuminating apparatus which improve color unevenness by using the white light source.

Means for Solving the Problems

The present invention has been completed based on the finding that if the phosphor layer of a white light source satisfies a predetermined condition, the white light source with good light distribution can be obtained.

The white light source according to the present invention solves the above problems and comprises: an insulating substrate; a light-emitting diode chip which is provided on the insulating substrate and emits ultraviolet light with a wavelength of 330 nm to 410 nm; and a phosphor layer which is formed so as to cover the light-emitting diode chip, contains a red emitting phosphor, a green emitting phosphor, and a blue emitting phosphor as a phosphor, and the phosphors are dispersed in a cured transparent resin, wherein when it is assumed that the shortest distance between a surface of the phosphor layer and a peripheral portion of the light-emitting diode chip is t(mm) and the mean free path defined by the following expression (1) is L(mm), the t and L satisfy $3.2 \leq t/L$.

[Expression 1]

$$L = 1/(n \times \sigma) \quad (1)$$

(n: number of phosphors per unit volume of the phosphor layer (pcs/ mm$^3$), σ: average cross section area of a phosphor in the phosphor layer (mm$^2$).)

Further, the backlight according to the present invention solves the above problems and uses the white light source.

Furthermore, the liquid crystal display apparatus according to the present invention solves the above problems and comprises the backlight.

Still furthermore, the illuminating apparatus according to the present invention solves the above problems and uses the white light source.

ADVANTAGES OF THE INVENTION

The white light source according to the present invention has good light distribution.

The backlight, the liquid crystal display apparatus, and the illuminating apparatus according to the present invention have little color unevenness.

DESCRIPTION OF SYMBOLS

1 white light source
2 insulating substrate
3 LED chip
4 phosphor layer
41 first shape portion of phosphor layer
42 second shape portion of phosphor layer
43 dome-shaped end surface
Description Of Embodiments
[White Light Source]

Figure 1:
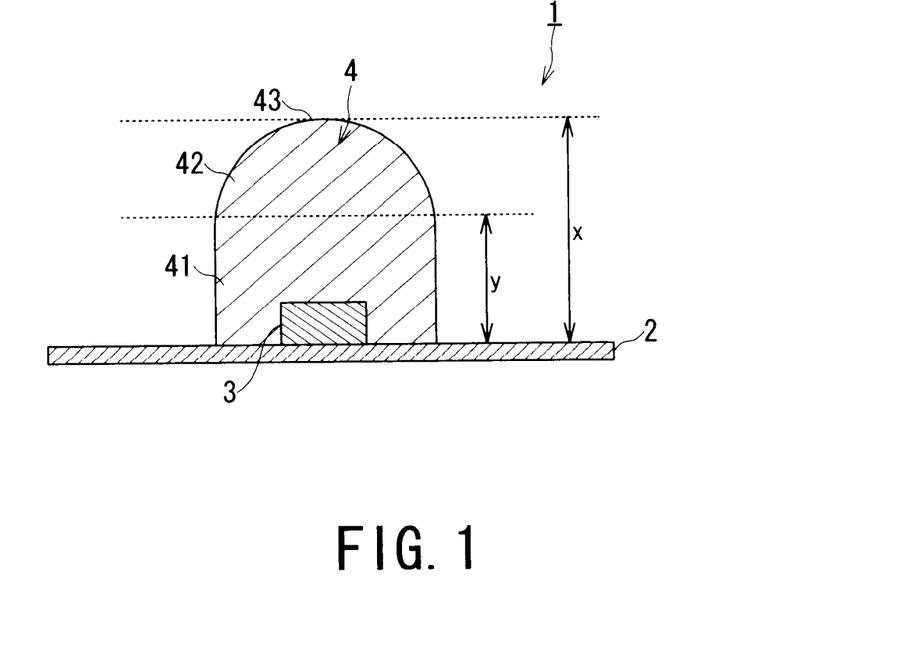
FIG. 1 is a sectional view illustrating an example of a white light source according to the present invention.

Hereinafter, the white light source according to the present invention will be described. FIG. 1 is a sectional view illustrating an example of the white light source according to the present invention. In the figure, reference numeral 1 denotes a white light source, reference numeral 2 denotes an insulating substrate, reference numeral 3 denotes an LED chip, reference numeral 4 denotes a phosphor layer, reference character x denotes the height of the phosphor layer, and reference character y denotes the height of a body portion of the phosphor layer.

(Insulating Substrate)

The insulating substrate 2 is a substrate having electrical insulation. Examples of the insulating substrate 2 include a ceramic substrate and a printed-circuit board. A wire for connecting to the LED chip 3 is provided in a necessary position of the insulating substrate 2.

(Light-Emitting Diode Chip)

The LED chip 3 is placed on the insulating substrate 2.

The present invention uses a light-emitting diode chip which emits ultraviolet light having an emission peak at 330 nm to 410 nm as the LED chip (light-emitting diode chip) 3. The shape of the LED chip 3 is not particularly limited.

If the emission peak of the light-emitting diode chip is less than 330 nm, the emission peak is different from the excitation wavelength range of the phosphor. Therefore, another phosphor adjustment is required. In addition, ultraviolet light is too strong and may adversely affect human body. Meanwhile, if the emission peak of the light-emitting diode chip exceeds 410 nm, blue is too strong and the emission peak is different from the excitation wavelength range of the phosphor. Therefore, another phosphor adjustment may be required.

(Phosphor Layer)

The phosphor layer 4 is formed so as to cover the light-emitting diode chip 3 and contains a red emitting phosphor, a green emitting phosphor, and a blue emitting phosphor as the phosphors which are dispersed in the cured transparent resin.

The phosphors dispersed in the phosphor layer 4 include at least three kinds of phosphors: a red emitting phosphor, a green emitting phosphor, and a blue emitting phosphor.

The red emitting phosphor, the green emitting phosphor, and the blue emitting phosphor may be any phosphor as long as the phosphor emits red, green, or blue respectively by light with an excitation wavelength of 330 nm to 410 nm. In consideration of color rendering, luminance characteristics, and the like, the following phosphors are desirable.

(Red Phosphor Powder)

As the red phosphor powder, red phosphor powder which emits red light with a peak wavelength of 620 nm or more and 780 nm or less by light with an excitation wavelength of 330 nm to 410 nm is used. As the red phosphor powder, for example, powder consisting of at least one material selected from a group of red phosphor powder consisting of europium activated lanthanum oxysulfide having a composition expressed by the following expression (2) and red phosphor powder having a composition expressed by the following expression (3) is used.

[Formula 1]

$$(La_{1-x-y}Eu_xM_y)_2O_2S \tag{2}$$

(where M is at least one element selected from Sb, Sm, Ga, and Sn; and x and y are a value satisfying $0.01<x<0.15$ and $0\leq y<0.03$ respectively.)

It is preferable that M in the expression (2) is at least one element selected from Sb, Sm, Ga, and Sn because the red phosphor powder has a high light-emitting efficiency.

[Formula 2]

$$(Sr_xCa_{1-x})SiAlN_3{:}Eu \tag{3}$$

(where x is a value satisfying $0\leq x<0.4$.)

It is preferable that x in the expression (3) is within the above range because the red phosphor powder has an appropriate wavelength range of light to emit, a high light-emitting efficiency, and is well balanced between the wavelength range and the light-emitting efficiency. The larger the x in the expression (3) is within the above range, the shorter the wavelength of the light emitted by the red phosphor powder is likely to be; and the smaller the x is within the above range, the higher the light-emitting efficiency of the red phosphor powder is likely to be.

(Green Phosphor Powder)

As the green phosphor powder, green phosphor powder which emits green light with a peak wavelength of 490 nm to 575 nm by light with an excitation wavelength of 330 nm to 410 nm is used. As the green phosphor powder, for example, powder consisting of at least one material selected from a group of green phosphor powder consisting of europium manganese activated aluminate having a composition expressed by the following expression (4) and green phosphor powder having a composition expressed by the following expression (5) is used.

[Formula 3]

$$(Ba_{1-x-y-z}Sr_xCa_yEu_z)(Mg_{1-u}Mn_u)Al_{10}O_{17} \tag{4}$$

(where, x, y, z, and u are a value satisfying $0\leq x<0.2$, $0\leq y<0.1$, $0.005<z<0.5$, and $0.1<u<0.5$ respectively.)

It is preferable that z and u in the expression (4) are within the above respective ranges because the green phosphor powder has a high light-emitting efficiency. It is preferable that x and y in the expression (4) are within the above respective ranges because the green phosphor powder is well balanced between the life expectancy and the luminance. If x in the expression (4) is equal to or greater than 0.2, the life expectancy of the green phosphor powder may be reduced.

[Formula 4]

$$(Sr_{2-x-y-z-u}Ba_xMg_yEu_zMn_u)SiO_4 \tag{5}$$

(where, x, y, z, and u are a value satisfying $0.1<x<0.4$, $0.005<y<0.21$, $0.05<z<0.3$, and $0.001<u<0.04$, respectively.)

It is preferable that x in the expression (5) is within the above range because the wavelength of the light emitted by the green phosphor powder is suitable for illumination and backlight. The larger the x in the expression (5) is within the above range, the shorter the wavelength of the light emitted by the green phosphor powder is, and thus the more suitable for backlight.

It is preferable that y in the expression (5) is within the above range because an Mn solid solution is sufficiently formed in the green phosphor powder.

It is preferable that z in the expression (5) is within the above range because the green phosphor powder has a high light-emitting efficiency.

It is preferable that u in the expression (5) is within the above range because the wavelength of the light emitted by the green phosphor powder is suitable for illumination and backlight. The larger the u in the expression (5) is within the above range, the longer the wavelength of the light emitted by the green phosphor powder is, and thus the more suitable for illumination.

(Blue Phosphor Powder)

As the blue phosphor powder, blue phosphor powder which emits blue light with a peak wavelength of 430 nm to 460 nm by light with an excitation wavelength of 330 nm to 410 nm is used. As the blue phosphor powder, for example, blue phosphor powder having a composition expressed by the following expression (6) is used.

[Formula 5]

$$(Sr_{1-x-y-z}Ba_xCa_yEu_z)_5(PO_4)_3Cl \tag{6}$$

(where, x, y, and z are a value satisfying $0\leq x<0.5$, $0\leq y<0.1$, $0.005<z<0.1$ respectively.)

It is preferable that x and y in the expression (6) are within the above respective ranges because the wavelength of the light emitted by the blue phosphor powder is suitable for a white LED lamp for use in illumination and backlight.

The larger the x and y in the expression (6) are within the above respective ranges, the more the light-emitting component of a long wavelength of the light emitted by the blue phosphor powder increases, and thus the white LED lamp is more suitable for illumination. The smaller the x and y in the expression (6) are within the above respective ranges, the narrower the spectrum width of the light emitted by the blue phosphor powder is, and thus the white LED lamp is more suitable for backlight. It is preferable that z in the expression (6) is within the above range because the blue phosphor powder has a high light-emitting efficiency.

In consideration of color rendering, light-emitting uniformity, and luminance characteristics of the white light source 1, the red emitting phosphor, the green emitting phosphor, and the blue emitting phosphor are appropriately combined and the amount of a phosphor to be combined is changed. Moreover, the phosphors dispersed in the phosphor layer 4 may include not only the red emitting phosphor, the green emitting phosphor, and the blue emitting phosphor but also a phosphor which emits yellow or orange by light with an excitation wavelength of 330 nm to 410 nm.

The phosphor dispersed in the phosphor layer 4 is preferably such that the average particle diameter is 10 μm to 60 μm. Here, the average particle diameter refers to a cumulative 50% particle diameter $D_{50}$.

If the average particle diameter is less than 10 μm, the phosphor particles are too fine, and if the average particle diameter exceeds 60 μm, the phosphor particles are too large; and thus it is difficult to adjust t/L to t/L≦3.2.

The cured transparent resin of the phosphor layer 4 is obtained by curing a transparent resin. The transparent resin is not particularly limited as long as the resin is transparent. For example, a silicone resin and an epoxy resin are used.

The phosphor content of the phosphor layer 4 is preferably 20 mass % to 80 mass %. Here, the phosphor content refers to the mass ratio of a phosphor to the total mass of the phosphor and the cured transparent resin.

If the phosphor content is less than 20 mass %, the light emitting amount is reduced, which requires the phosphor layer to be thicker in order to secure the light emitting amount, resulting in a larger white light source 1, which is likely to be not suitable for practical use.

Meanwhile, if the phosphor content exceeds 80 mass %, it may be difficult to uniformly combine and apply phosphors of each color. Note that if the phosphor content exceeds 90 mass %, the light from the light-emitting diode may not be uniformly transmitted in the phosphor layer.

As illustrated in FIG. 1, the phosphor layer 4 is formed so as to cover the LED chip 3 including its side surface. It is preferable that the phosphor layer 4 is formed so as to cover the LED chip 3 including its side surface because the white light source 1 has a high light distribution. Note that if the white light source 1 is sufficient to obtain only white light without particularly considering the light distribution, the phosphor layer 4 may be formed so as to cover only the light emitting surface of the LED chip 3.

According to the white light source 1 of the present invention, when it is assumed that the shortest distance between a surface of the phosphor layer 4 and a peripheral portion of the light-emitting diode chip 3 is t(mm) and the mean free path defined by the following expression (1) is L(mm), the t and L satisfy 3.2≦t/L.

[Expression 2]

$$L = 1/(n \times \sigma) \quad (1)$$

(n: number of phosphors per unit volume of the phosphor layer (pcs/mm³), σ: average cross section area of a phosphor in the phosphor layer (mm²).)

The shortest distance t(mm) between a surface of the phosphor layer and a peripheral portion of the light-emitting diode chip refers to the shortest distance between a surface of the phosphor layer 4 and an arbitrary peripheral edge portion of the LED chip 3. In other words, t refers to a minimum value of the thickness of the phosphor layer. Note that when the LED chip 3 has a cross sectional shape having angles such as a quadrangle and a trapezoidal, the arbitrary peripheral edge portion of the LED chip 3 may be an angle portion of the cross sectional shape.

Figure 2:
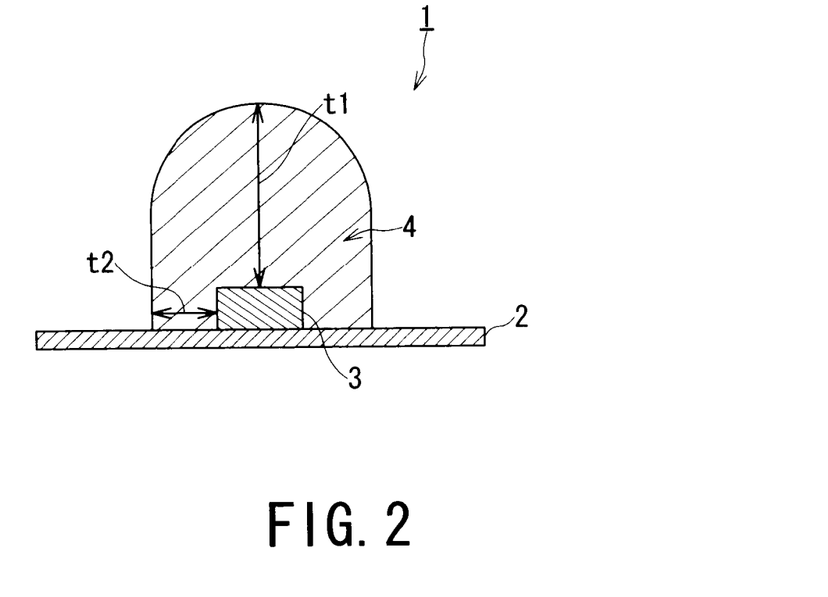
FIG. 2 describes a method of measuring the shortest distance t.

FIG. 2 describes a method of measuring the shortest distance t. As illustrated in FIG. 2, the distances t1, t2, and the like from a peripheral edge portion of the LED chip to a surface of the phosphor layer are calculated. If t2 is the shortest, t2 is the shortest distance t.

The shortest distance t is used to calculate the smallest thickness of the phosphor layer 4. For this reason, when a coating layer which includes a cured transparent resin and the like and does not contain a phosphor is further provided on a surface of the phosphor layer 4, the thickness of the coating layer is not used to calculate the shortest distance t.

The mean free path L(mm) is an index indicating the spacing between phosphors dispersed in the phosphor layer and is defined by the above expression (1). In the expression (1), n denotes the number of phosphors per unit volume (pcs/mm³), and σ denotes the average cross section area (mm²).

The number of phosphors n per unit volume refers to the number of phosphors per 1 mm³ in the phosphor layer. If the number of phosphors n per unit volume can be directly measured, the measured value is used, but the number of phosphors n per unit volume may be calculated simply by the following method.

More specifically, first, a cubic piece with a unit volume of 400 μm×400 μm×400 μm is extracted from the phosphor layer. Then, a surface of 400 μm×400 μm (hereinafter referred to as a first surface) is arbitrarily selected from the surfaces of the cubic piece. The number of phosphors in the first surface is measured by image analysis to obtain number of phosphors N1 per unit area. Further, an arbitrary surface (hereinafter referred to as a second surface) is selected from the four surfaces perpendicular to the first surface. A straight line is drawn on the second surface from a side (hereinafter referred to as a first side) joining the first surface and the second surface to a side facing the first side among the four sides of the second surface. Five straight lines are drawn in an arbitrary interval in parallel. Then, the number of phosphor particles on each of the five straight lines is measured and assumed to be the number of phosphors N2 to N6. Then, the average value N7 of N2 to N6 is calculated by the expression: N7=(N2+N3+N4+N5+N6)/5. Further, the number of phosphors N8 in the phosphor layer with a unit volume of 400 μm×400 μm×400 μm is calculated by the expression: N8=N1×N7. Then, the number of phosphors n per unit volume (pcs/mm³) is calculated by converting N8 to a value per 1 mm³.

The average cross section area σ (mm²) refers to the average value of the projected areas of phosphors in the phosphor layer which is calculated by assuming that each phosphor is a true sphere. A specific method of calculating the average cross section area σ (mm²) is as follows. First, the average particle diameter r1 of a phosphor is calculated from the particle size distribution of the phosphors in the phosphor layer. The average volume of the phosphor is calculated from the average particle diameter r1. Then, the radius r2 of the phosphor is calculated from the average volume of the phosphor by assuming that a phosphor is a true sphere. Further, the projected area of a true circle of the phosphor is calculated from the radius r2 of the phosphor by assuming that a phosphor is a true sphere, and the projected area is assumed to be the average cross section area σ (mm$^2$).

The t/L is an index indicating the dispersion state of the phosphors in the phosphor layer. The greater the value of t/L is, the more the number of phosphors between the surface of the phosphor layer and the peripheral portion of the light-emitting diode chip increases.

According to the present invention, the t/L is such that $3.2 \leq t/L$.

When $3.2 \leq t/L$, the phosphors in the phosphor layer have a good dispersion state where the phosphors are spaced apart with a distance susceptible to reflection and scattering occurs effectively in the phosphor layer. Thus, the white light source improves light distribution of white light and reduces variation(scattering) in light distribution.

Note that when the t/L exceeds 6, the number of phosphors in the phosphor layer excessively increases, absorption loss in phosphor increases, and thus the luminance of the white light source decreases. Thus, t/L is preferably $3.2 \leq t/L \leq 6$, and further preferably $3.5 \leq t/L \leq 5.5$.

The phosphor layer 4 includes a cylindrical first shape portion 41 formed on the insulating substrate 2 side; and a dome-shaped second shape portion 42 formed to continue to an end portion of the first shape portion 41; and is a cylindrical body having a dome-shaped end surface 43. In other words, the phosphor layer 4 is formed into an external shape of a so-called cannonball. It is preferable that the phosphor layer 4 is formed in a cannonball shape because the white light source 1 is likely to uniformly emit light.

The phosphor layer 4 is formed such that the ratio of the axial length of the first shape portion 41 to the axial length of the entire phosphor layer 4 is generally 10% or more, preferably 10% to 95%. It is preferable that the ratio of the axial length of the first shape portion 41 to the axial length of the entire phosphor layer 4 is in this range because the white light source 1 is likely to uniformly emit light.

In FIG. 1, reference character x denotes the axial length of the entire phosphor layer 4 and reference character y denotes the axial length of the cylindrical first shape portion 41. The phosphor layer 4 of the white light source 1 is such that the ratio of the axial length y of the first shape portion 41 to the axial length x of the entire phosphor layer 4, namely, y/x is generally equal to or greater than 0.5%, preferably 10% or more, further preferably 10% to 95%.

Note that if the white light source 1 does not have the cylindrical first shape portion 41 (y=0), namely, y/x is 0%, the phosphor layer is mountain-shaped. Likewise, if the phosphor layer is mountain-shaped (y/x is 0%), or y/x exceeds 0% and less than 0.5%, all or most of the surface of the phosphor layer is curved. Therefore, when light is emitted from the phosphor layer, the light is refracted and thus the light path of the light emitted by the white light source is likely to be non-uniform.

Further, if the white light source 1 does not have the dome-shaped second shape portion 42 (x=y), namely, y/x is 100%, the phosphor layer is bar-shaped. Likewise, if the phosphor layer is bar-shaped (y/x is 100%), or y/x exceeds 95% and less than 100%, an angle portion is formed around the front end portion of the phosphor layer, light is difficult to reach the angle portion, and thus the white light source is likely to emit non-uniform light.

Note that the phosphor layer 4 illustrated in FIG. 1 is an example of the phosphor layer formed in a cannonball shape, and the phosphor layer of the white light source of the present invention is not limited to the cannonball shape, but may be formed in any shape.

The white light source of the present invention can be manufactured, for example, in such a manner that a light-emitting diode chip is mounted on an insulating substrate and then a phosphor layer is formed on the insulating substrate. The phosphor layer is formed on the insulating substrate, for example, by preparing a paste material, preparing a phosphor paste composition, and applying and drying the phosphor paste composition as follows.

(Preparing Paste Material)

First, a paste material containing a phosphor and a transparent resin is prepared. The paste material can be obtained by mixing a phosphor and a transparent resin using a well-known agitator. Preferably, the paste material is prepared to have a high phosphor content and a relatively high viscosity.

(Preparing Phosphor Paste Composition)

Then, dispersion processing is performed on the paste material to prepare the phosphor paste composition in which the phosphor is sufficiently dispersed in the transparent resin. The phosphor paste composition can be obtained by performing dispersion processing on the paste material using a dispersive mixing apparatus.

A well-known dispersive mixing apparatus can be used as the dispersive mixing apparatus. The use of a roll-type dispersion machine is preferable because an appropriate compression force and shear force can be applied to the paste material. The roll-type dispersion machine has a plurality of rolls having different rotation speeds and performs dispersion processing on dispersed medium such as a paste material passing through a space between rolls by a compression action using an inter-roll pressure and a shear action between rolls having different rotation speeds. Further, of the roll-type dispersion machines, a triple roll mill is more preferable. The roll-type dispersion machine having rolls made of fine ceramics such as alumina, silicon nitride, and silicon carbide is preferable because less impurities are mixed in the dispersed medium such as the paste material. Further, the use of rolls made of fine ceramics, especially high alumina (high purity alumina having a purity of 99% or more) is more preferable because further less impurities are mixed in.

It is preferable to perform defoaming and agitation processing on the phosphor paste composition obtained by the dispersion processing using a defoaming agitator as needed because the phosphor paste composition is sufficiently deaired. An example of the defoaming agitator is such that a rotating container containing a material to be processed such as a phosphor paste composition is eccentrically placed on a turntable, the container performs self-rotation on the turntable and revolution to an axis of the turntable, and the self-rotation and revolution of the container is enabled during reduced pressure.

It is preferable that when defoaming and agitation processing is performed under reduced pressure using a defoaming agitator, the reduced pressure condition is in a range of 5 mTorr to 50 mTorr because deairing is sufficiently performed and the phosphor paste composition with a high viscosity is easily obtained. Further, it is more preferable that when defoaming and agitation processing is performed while the reduced pressure condition is gradually lowered from 50 mTorr to 5 mTorr because deairing is more sufficiently performed and the phosphor paste composition with a higher viscosity is easily obtained.

Furthermore, it is preferable that the above dispersion apparatus is used as needed to perform dispersion processing again on the phosphor paste composition obtained by performing dispersion processing and defoaming and agitation processing because more uniform phosphor paste composition is obtained.

It is preferable to increase the viscosity of the phosphor paste composition in a range allowing the phosphor particles to be dispersed because the phosphor layer having a high phosphor filling factor can be formed. Preferably, the viscosity of the phosphor paste composition is in a range of 3000 Pa·s to 10000 Pa·s.

The phosphor paste composition may be mixed with an organic solvent, a binder resin, and the like as needed. The additive amounts of the organic solvent and the binder resin of the phosphor paste composition are appropriately adjusted to obtain a desired viscosity or a desired phosphor content of the phosphor paste composition.

The addition of an organic solvent, a binder resin, and the like to the phosphor paste composition is achieved using the dispersion apparatus to perform dispersion processing on the phosphor paste composition to which an organic solvent, a binder resin, and the like are added. Examples of the dispersion apparatus include a homogenizer, a dispar, a propeller-type agitator, a kneader, a planetary mixer, a mortar, a bamboo pallet, and the like.

(Applying and Drying Phosphor Paste Composition)

Then, an insulating substrate on which the LED chip is mounted is prepared and a phosphor paste composition is applied so as to cover the LED chip on the insulating substrate and dried to form a phosphor layer on the insulating substrate.

As needed, the LED chip may be wired by wire bonding or the like before the phosphor paste composition is applied to the LED chip.

Further, the phosphor layer may be formed in such a manner that one LED chip is covered with one phosphor layer or a plurality of LED chips is covered with one phosphor layer.

The white light source according to the present invention has a good light distribution and thus little variation (scattering) in light emission. Therefore, the white light source according to the present invention is used as a planar light source such as a backlight, the planar light source with little variation in light emission can be obtained. Further, the white light source according to the present invention has a good light distribution and little variation in light emission and thus is preferably used for an illuminating apparatus.

[Backlight]

The backlight according to the present invention uses the white light source according to the present invention. The backlight according to the present invention can be manufactured using the above white light source and a well-known method.

The backlight according to the present invention is used as a planar light source with little variation in light emission. Thus, the backlight according to the present invention is preferably used for a liquid crystal display apparatus such as a TV and a PC display.

[Liquid Crystal Display Apparatus]

The liquid crystal display apparatus according to the present invention has the backlight according to the present invention. The liquid crystal display apparatus according to the present invention can be manufactured using the above backlight and a well-known method.

The liquid crystal display apparatus according to the present invention has little variation in light emission of the backlight. Thus, the liquid crystal display apparatus according to the present invention is preferably used for an application such as a TV and a PC display.

[Illuminating Apparatus]

The illuminating apparatus according to the present invention uses the white light source according to the present invention. The illuminating apparatus according to the present invention can be manufactured using the above white light source and a well-known method.

The illuminating apparatus according to the present invention has little variation in light emission of the white light source. Thus, the illuminating apparatus according to the present invention is preferably used for an illuminating apparatus for home use and business use or the like.

EXAMPLES

Hereinafter, examples of the present invention will be described, but the present invention should not be construed to be limited to these examples.

Example 1

(Mounting Light-Emitting Diode Chip)

A 3 mm high×3 mm wide×0.2 mm thick aluminum nitride insulating substrate (with a thermal conductivity of 220 W/m–K) is used, and a plurality of square-shaped metal patterns each consisting of a Ti/ Pt/Au layer is sequentially formed on the surface. Further, the aluminum nitride insulating substrate includes a through-hole reaching the rear surface side, and an electrode pad is formed on the rear surface of the substrate.

Furthermore, a light-emitting diode chip (LED chip) which emits ultraviolet light with an excitation wavelength of 390 nm is bonded to each metal pattern and a lower electrode of the light-emitting diode chip is electrically connected to each metal pattern. Still furthermore, the upper electrode of the light-emitting diode chip is electrically connected to another metal pattern adjacent to the metal pattern on which the light-emitting diode chip is mounted by a conducting wire using a bonding wire method. Note that the size of the light-emitting diode chip is 0.36 mm high×0.36 mm wide×0.2 mm thick.

(Forming Phosphor Layer)

A phosphor layer was formed on the insulating substrate on which the light-emitting diode chip was mounted in the following procedure.

As the blue phosphor, an europium activated alkaline earth chlorophosphate $(Sr_{0.99}Eu_{0.01})_{10}(PO_4)_6Cl_2$ was prepared; as the green phosphor, an europium manganese activated aluminate phosphor $(Ba_{0.726}Eu_{0.274})(Mg_{0.55}Mn_{0.45})Al_{10}O_{17}$ was prepared; and as the red phosphor, an europium activated lanthanum oxysulfide $(La_{0.883}Sm_{0.002}Eu_{0.115})_2O_2S$ was prepared.

<Preparing Paste Material>

First, a blue phosphor, a green phosphor, and a red phosphor were mixed with a silicone resin by a mixing agitator to prepare a paste material.

<Preparing Phosphor Paste Composition>

Then, dispersion processing was performed on the paste material for eight hours using a triple roll mill having a high alumina roll (a first dispersion process). After the first dispersion process, defoaming processing was performed on the paste material for ten minutes under 5 mTorr using a defoaming agitator (a first defoaming process). After the first defoaming process, dispersion processing was performed on the paste material under the same condition as that of the first dispersion process (a second dispersion process). After the second dispersion process, defoaming processing was performed on the paste material under the same condition as that of the first defoaming process (a second defoaming process). After the second defoaming process, dispersion processing was performed on the paste material under the same condition as that of the first dispersion process (a third dispersion process). After the third dispersion process, a phosphor paste composition was obtained. The phosphor paste composition had a viscosity of 6000 Pa·s.

<Applying and Drying Phosphor Paste Composition>

An insulating substrate on which a light-emitting diode chip was mounted was prepared; and a phosphor paste composition was applied so as to cover the light-emitting diode chip on the insulating substrate and was dried to form a phosphor layer on the insulating substrate. The phosphor layer was formed in a cannonball shape as illustrated in FIG. 1. A white light source was obtained by forming the phosphor layer.

(Measuring Light Distribution)

The light distribution of the obtained white light source was measured. The luminosity was measured based on the JIS-C-8152 condition B. Further, the variation in light distribution was calculated in a range of 20° to 160° by the expression: light distribution variation=(minimum luminosity/maximum luminosity).

Tables 1 and 2 illustrate the manufacturing conditions of the white light source. Table 2 illustrates the results of variations in light distribution of the white light source.

Further, Examples and Comparative Examples described below are also included in Tables 1 and 2 with the manufacturing conditions of the white light source illustrated in Tables 1 and 2 and the results of variations in light distribution of the white light source illustrated in Table 2.

Figure 3:
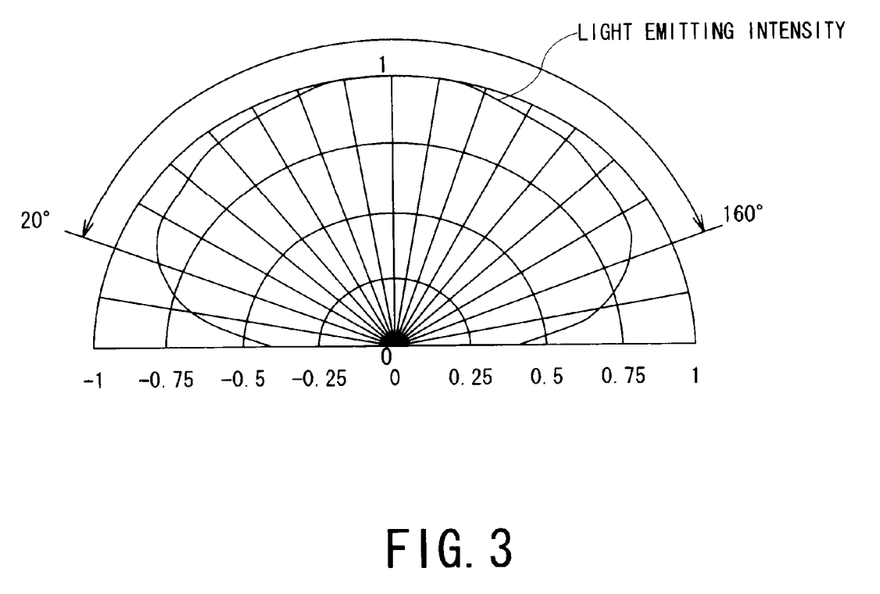
FIG. 3 illustrates measurement results of light distribution of the white light source obtained by Example 1.

FIG. 3 illustrates the measurement results of the light distribution of the white light source obtained in Example 1.

TABLE 1

|  | Minimum of Thickness of Phosphor Layer t (mm) | Phosphor Content of Phosphor Layer (Mass %) | Phosphor Content of Phosphor Layer (Vol. %) | Average Particle Diameter of Phosphor (mm) | Mean Free Path L (mm) | t/L | Height of Flat Portion y (mm) | Height of Phosphor Layer x (mm) | y/x | Variation in Light Distribution |
|---|---|---|---|---|---|---|---|---|---|---|
| Example 1 | 0.6 | 70 | 32 | 0.055 | 0.11 | 5.45 | 0.01 | 1.2 | 0.008 | 0.820 |
| Example 2 | 0.6 | 54 | 19 | 0.050 | 0.17 | 3.46 | 0.01 | 1.2 | 0.008 | 0.815 |
| Example 3 | 0.6 | 52 | 18 | 0.050 | 0.18 | 3.24 | 0.01 | 1.2 | 0.008 | 0.810 |
| Comparative Example 1 | 0.6 | 49 | 16 | 0.050 | 0.2 | 3.00 | 0.01 | 1.2 | 0.008 | 0.790 |
| Example 4 | 0.6 | 60 | 23 | 0.050 | 0.14 | 4.29 | 0.6 | 1.2 | 0.5 | 0.852 |
| Example 5 | 0.6 | 52 | 18 | 0.050 | 0.18 | 3.24 | 0.6 | 1.2 | 0.5 | 0.842 |
| Comparative Example 2 | 0.6 | 26 | 7 | 0.020 | 0.2 | 3.00 | 0.01 | 1.2 | 0.008 | 0.796 |

TABLE 2

|  | First Mixing Process | | | First Defoaming Process | | Second Mixing Process | | Second Defoaming Process | | Third Mixing Process | |
|---|---|---|---|---|---|---|---|---|---|---|---|
|  | Apparatus | Time (Hr) | Pressure (mTorr) | Time (min) | Apparatus | Time (Hr) | Pressure (mTorr) | Time (min) | Apparatus | Time (Hr) | Apparatus | Time (Hr) |
| Example 1 | Triple Roll Mill | 8 | 5 | 10 | Triple Roll Mill | 8 | 5 | 10 | Triple Roll Mill | 8 |
| Example 2 | Triple Roll Mill | 10 | 5 | 10 | Triple Roll Mill | 10 | None | None | None | None |
| Example 3 | Triple Roll Mill | 10 | 30 | 5 | Triple Roll Mill | 14 | None | None | None | None |
| Comparative Example 1 | One Roll Mill | 20 | None | None | None | None | None | None | None | None |
| Example 4 | Triple Roll Mill | 8 | 5 | 10 | Triple Roll Mill | 8 | 5 | 10 | Triple Roll Mill | 8 |
| Example 5 | Triple Roll Mill | 24 | None | None | None | None | None | None | None | None |
| Comparative Example 2 | One Roll Mill | 20 | None | None | None | None | None | None | None | None |

The light emission characteristics of the white light source of Example 1 were evaluated. As the evaluation apparatus, a total light flux measurement system SMLS manufactured by Labsphere Inc. and an instantaneous multi-photometric system MPCD-3700 manufactured by Otsuka Electronics Co., Ltd. were used. When 30 mA is applied to the white light source, the voltage was 3.3 V. The outgoing beam from the light source had a light flux of 35 lm; and x was 0.28 and y was 0.23 in the CIE XYZ color system.

Examples 2 to 5 and Comparative Examples 1 and 2

A white light source was manufactured under the same conditions as those of the Example 1 except that the manufacturing conditions of the white light source were changed as illustrated in Tables 1 and 2.

In the Comparative Examples 1 and 2, one roll mill was used instead of the triple roll mill as illustrated in Table 1.

Figure 4:
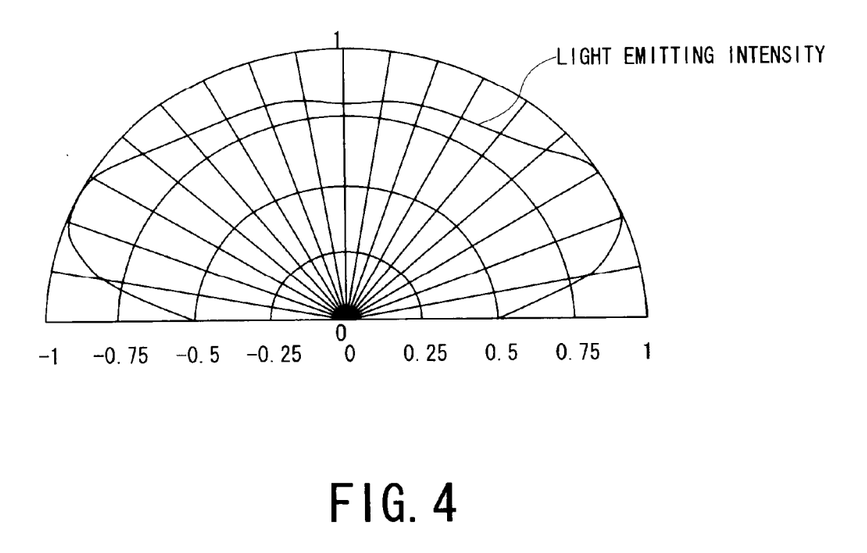
FIG. 4 illustrates measurement results of light distribution of the white light source obtained by Comparative Example 2.

FIG. 4 illustrates the measurement results of the light distribution of the white light source obtained in Comparative Example 2.

It was found from FIGS. 3 and 4 that the white light source obtained in Example 1 illustrated in FIG. 3 had a uniform light emitting intensity and less variation in a range of 20° to 160° in comparison with the white light source obtained in Comparative Example 2 illustrated in FIG. 4.

When a backlight (planar light source) for use in a liquid crystal display apparatus was manufactured using a plurality of white light sources obtained in the above Examples, the backlight with little intensity unevenness was obtained.

Example 6

A white light source was manufactured under the same conditions as those of the Example 1 except that the kinds of the phosphors were changed. More specifically, as the red phosphor, $(Sr_{0.01}Ca_{0.99})SiAlN_3$:Eu was used; as the green phosphor, $(Sr_{1.58}Ba_{0.11}Mg_{0.2}Eu_{0.1}Mn_{0.01})SiO_4$ was used; and as the blue phosphor, $(Sr_{0.85}Ba_{0.01}Ca_{0.09}Eu_{0.05})_{10}(PO_4)_3Cl$ was used. The outgoing beam from the obtained white light source had a light flux of 37 lm; and x was 0.29 and y was 0.23 in the CIE XYZ color system.

Further, data such as light distribution variations was measured, approximately the same results as those of Example 1 were obtained.

The invention claimed is:

1. A white light source comprising:
   an insulating substrate;
   a light-emitting diode chip which is provided on the insulating substrate and emits ultraviolet light with a wavelength of 330 nm to 410 nm; and
   a phosphor layer which is formed so as to cover the light-emitting diode chip, contains a red emitting phosphor, a green emitting phosphor, and a blue emitting phosphor as phosphors, and the phosphors are dispersed in a cured transparent resin,
   wherein when it is assumed that a shortest distance between a surface of the phosphor layer and a peripheral portion of the light-emitting diode chip is t(mm) and the mean free path defined by the following expression (1) is L(mm), the t and L satisfy $3.2 \leq t/L$,
   [Expression 1]

$$L = 1/(n \times \sigma) \tag{1}$$

(n: number of phosphors per unit volume of the phosphor layer (pcs/mm$^3$), and σ: average cross section area of a phosphor in the phosphor layer (mm$^2$)).

2. The white light source according to claim 1, wherein the phosphor layer comprises:
   a cylindrical first shape portion formed on the insulating substrate side; and
   a dome-shaped second shape portion formed to continue to an end portion of the first shape portion;
   and is a cylindrical body having a dome-shaped end surface, and
   an axial length of the first shape portion is equal to or greater than 10% of the axial length of the entire phosphor layer.

3. The white light source according to claim 1, wherein the t and L satisfy $3.2 \leq t/L \leq 6$.

4. The white light source according to claim 1, wherein the red emitting phosphor includes at least one kind of phosphor powder with a composition expressed by the following expression (2),
[Formula 1]

$$(La_{1-x-y}Eu_xM_y)_2O_2S \tag{2}$$

(where M is at least one element selected from Sb, Sm, Ga, and Sn; and x and y are a value satisfying $0.01 < x < 0.15$ and $0 \leq y < 0.03$ respectively); and
   phosphor powder with a composition expressed by the following expression (3),
[Formula 2]

$$(Sr_xCa_{1-x})SiAlN_3:Eu \tag{3}$$

(where x is a value satisfying $0 \leq x < 0.4$).

5. The white light source according to claim 1, wherein the green emitting phosphor includes at least one kind of phosphor powder with a composition expressed by the following expression (4),
[Formula 3]

$$(Ba_{1-x-y-z}Sr_xCa_yEu_z)(Mg_{1-u}Mn_u)Al_{10}O_{17} \tag{4}$$

(where, x, y, z, and u are a value satisfying $0 \leq x < 0.2$, $0 \leq y < 0.1$, $0.005 < z < 0.5$, and $0.1 < u < 0.5$, respectively); and
   phosphor powder with a composition expressed by the following expression (5),
[Formula 4]

$$(Sr_{2-x-y-z-u}Ba_xMg_yEu_zMn_u)SiO_4 \tag{5}$$

(where, x, y, z, and u are a value satisfying $0.1 < x < 0.4$, $0.005 < y < 0.21$, $0.05 < z < 0.3$, and $0.001 < u < 0.04$, respectively).

6. The white light source according to claim 1, wherein the blue emitting phosphor includes phosphor powder with a composition expressed by the following expression (6),
[Formula 5]

$$(Sr_{1-x-y-z}Ba_xCa_yEu_z)_5(PO_4)_3Cl \tag{6}$$

(where, x, y, and z are a value satisfying $0 \leq x < 0.5$, $0 \leq y < 0.1$, $0.005 < z < 0.1$ respectively).

7. The white light source according to claim 1, wherein the phosphor has an average particle diameter of 10 μm to 60 μm.

8. A backlight using the white light source according to claim 1.

9. A liquid crystal display apparatus having the backlight according to claim 8.

10. An illuminating apparatus using the white light source according to claim 1.

* * * * *